United States Patent
Cao et al.

(10) Patent No.: US 11,105,879 B1
(45) Date of Patent: Aug. 31, 2021

(54) TIME-DOMAIN SEGMENTED CALIBRATION METHOD FOR A CHARACTERISTIC IMPEDANCE OF A TIME-DOMAIN REFLECTOMETER

(71) Applicant: University of Electronic Science and Technology of China, Chengdu (CN)

(72) Inventors: Yong Cao, Chengdu (CN); Hong Wen, Chengdu (CN); Yang Tu, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 0 days.

(21) Appl. No.: 17/218,192

(22) Filed: Mar. 31, 2021

(30) Foreign Application Priority Data

Apr. 1, 2020  (CN) .......................... 202010249939.7

(51) Int. Cl.
*G01R 35/00* (2006.01)
*G01R 27/26* (2006.01)

(52) U.S. Cl.
CPC ........... *G01R 35/005* (2013.01); *G01R 27/26* (2013.01)

(58) Field of Classification Search
CPC ........ G01R 27/00; G01R 27/02; G01R 27/26; G01R 31/00; G01R 31/28; G01R 31/317;
(Continued)

(56) References Cited

U.S. PATENT DOCUMENTS 5,012,181 A * 4/1991 Eccleston ............ G01R 15/125
324/115
5,063,353 A   11/1991 Gubisch
(Continued)

FOREIGN PATENT DOCUMENTS

CN      102213754 A    10/2011
CN      105553543 A     5/2016

OTHER PUBLICATIONS

Lu Fumin, Calibration for time domain reflectometry modular in digital communication analyzer, 2017 IEEE 13th International Conference on Electronic Measurement & Instruments, 2017, pp. 259-262.
(Continued)

*Primary Examiner* — Hoai-An D. Nguyen
(74) *Attorney, Agent, or Firm* — Bayramoglu Law Offices LLC

(57) ABSTRACT

A time-domain segmented calibration method for a characteristic impedance of a time-domain reflectometer is provided. The method first segments the measured characteristic impedance value according to the reflection coefficients ρ, determines several boundary points with the reflection coefficients, and divides the range of the measured impedance according to the impedance values corresponding to the reflection coefficients of the boundary points, and then select a typical impedance value in the range as a reference impedance for calibration. The TDR instrument performs characteristic impedance calibration for each typical reference impedance value one by one, and stores them as calibration parameters of different groups. With respect to different impedance value ranges, the selection ranges of the calibration and measurement areas of TDR are different. When the measurement is performed, the 50Ω calibration parameter is used as the default reference for calculation.

3 Claims, 2 Drawing Sheets

(58) Field of Classification Search
CPC .............. G01R 31/3181; G01R 31/319; G01R 31/31903; G01R 31/31908; G01R 31/3191; G01R 33/00; G01R 33/0023; G01R 35/00; G01R 35/005; G01R 35/007
USPC ....... 324/74, 202, 500, 537, 750.01, 750.02, 324/600, 601; 702/85
See application file for complete search history.

(56) References Cited

U.S. PATENT DOCUMENTS

| | | | | |
|---|---|---|---|---|
| 5,182,618 | A * | 1/1993 | Heinonen | G01N 21/474 250/228 |
| 5,548,538 | A * | 8/1996 | Grace | G01R 27/28 324/605 |
| 8,081,008 | B2 * | 12/2011 | Liang | G01R 27/04 324/754.11 |
| 8,896,401 | B1 * | 11/2014 | Tsironis | H03H 7/38 333/263 |
| 11,002,749 | B2 * | 5/2021 | Klingauf | G01N 35/00693 |
| 2005/0060136 | A1 * | 3/2005 | Beige | G01R 27/32 703/22 |
| 2005/0234662 | A1 * | 10/2005 | Niedzwiecki | H04B 3/46 702/60 |
| 2007/0167056 | A1 * | 7/2007 | Shen | H05K 3/4638 439/262 |
| 2007/0265793 | A1 | 11/2007 | Booth, Jr. et al. | |
| 2011/0282593 | A1 * | 11/2011 | Nickel | G01R 31/66 702/39 |
| 2016/0109549 | A1 * | 4/2016 | Auzanneau | G01R 31/11 324/605 |

OTHER PUBLICATIONS

Li Xiaomei, Difference Measurement Method and Multi-Point Calibration Technology Research and Software Implementation in TDR, A Master Thesis Submitted to University of Electronic Science and Technology of China, 2014, pp. 1-74.

Zhi Li, et al., Research on Calibration of Time Domain Reflected Impedance Analyzer, 2014, vol. 3.

* cited by examiner

TIME-DOMAIN SEGMENTED CALIBRATION METHOD FOR A CHARACTERISTIC IMPEDANCE OF A TIME-DOMAIN REFLECTOMETER

CROSS REFERENCE TO THE RELATED APPLICATIONS

This application is based upon and claims priority to Chinese Patent Application No. CN 202010249939.7, filed on Apr. 1, 2020, the entire contents of which are incorporated herein by reference.

TECHNICAL FIELD

The invention relates to a method of calibrating measuring instruments, and more particularly, to a time-domain calibration method for a characteristic impedance of a time-domain reflectometer.

BACKGROUND

A time-domain reflectometer (TDR) is an instrument for testing the characteristics of electronic circuits. It can measure the characteristic impedance and other parameters of the printed circuit board (PCB), cable and other interconnected systems. It can also be used for calibrating the characteristic impedance sent out by the measuring instruments during research and development. When developing high-performance electronic measuring instruments, such as oscilloscope, network analyzer, ATC/DME avionics integrated tester instrument, the researcher needs to measure the characteristic impedance of the output channel, and the measured characteristic impedance usually has a typical value such as 25Ω, 50Ω, 75Ω, and 100Ω, or a special impedance value such as 12.5Ω, 150Ω, 180Ω, 220Ω, and 240Ω.

The traditional time-domain reflectometer is more accurate when measuring the impedance of 50Ω, while the error is relatively large when measuring the impedances of 25 Ω, 75Ω, and 100Ω. When measuring special impedances such as 12.5Ω, 150Ω, 180Ω, 220Ω, 240Ω, the error is greater. Furthermore, as the time-domain reflectometer is used for an extended period of time, there have been large system errors, and the measurement results of the time-domain reflectometer need to be corrected during use.

The calibration methods provided by the traditional IPC standard IPC-TM-650 2.5.5.7 Characteristic Impedance of Lines on Printed Boards by TDR (i.e. a characteristic impedance time-domain reflection test method for PCB transmission line) already cannot meet the more stringent test requirements for special impedances.

SUMMARY

An objective of the present invention is to overcome the shortcomings of the prior art, and to provide a time-domain calibration method for a characteristic impedance of a time-domain reflectometer, which can greatly reduce the measurement error and improve the measurement accuracy of the time-domain reflectometer.

In order to achieve the above objective, the present invention adopts the following technical solution. A time-domain segmented calibration method for a characteristic impedance of a time-domain reflectometer includes the following steps:

S1: saving initial parameters and corresponding relationships of a segmented calibration. The initial parameters of the segmented calibration include a reflection coefficient ($\rho$) of a boundary point, a measured impedance value range (Z), a calibration reference impedance, and a selection range of a calibration and measurement area of the time-domain reflectometer.

When $-1 \leq \rho \leq -0.5$, the measured impedance value range is $0 \leq Z \leq 15\Omega$, the calibration reference impedance is 12.5Ω, the selection range of the calibration and measurement area of the time-domain reflectometer is 65%-85% or 60%-80%.

When $-0.5 < \rho \leq -0.2$, the measured impedance value range is $15\Omega < Z \leq 35\Omega$, the calibration reference impedance is 25Ω, the selection range of the calibration and measurement area of the time-domain reflectometer is 65%-85% or 60%-80%.

When $-0.2 < \rho \leq 0.15$, the measured impedance value range is $35\Omega < Z \leq 65\Omega$, the calibration reference impedance is 50Ω, and the selection range of the calibration and measurement area of the time-domain reflectometer is 50%-70%.

When $0.15 < \rho \leq 0.25$, the measured impedance value range is $65\Omega < Z \leq 85\Omega$, the calibration reference impedance is 75Ω, the selection range of the calibration and measurement area of the time-domain reflectometer is 50%-70%.

When $0.25 < \rho \leq 0.45$, the measured impedance value range is $85\Omega < Z \leq 130\Omega$, the calibration reference impedance is 100Ω, the selection range of the calibration and measurement area of the time-domain reflectometer is 65%-85% or 60%-80%.

When $0.45 < \rho \leq 0.54$, the measured impedance value range is $130\Omega < Z \leq 170\Omega$, the calibration reference impedance is 150Ω, the selection range of the calibration and measurement area of the time-domain reflectometer is 65%-85% or 60%-80%.

When $0.54 < \rho \leq 0.6$, the measured impedance value range is $170\Omega < Z \leq 200\Omega$, the calibration reference impedance is 180Ω, the selection range of the calibration and measurement area of the time-domain reflectometer is 65%-85% or 60%-80%.

When $0.6 < \rho < +\infty$, the measured impedance value range is $200\Omega < Z < +\infty$, the calibration reference impedance is 220Ω, the selection range of the calibration and measurement area of the time-domain reflectometer is 65%-85% or 60%-80%.

S2: initializing the time-domain reflectometer, and enabling the time-domain reflectometer to measure and display a total length of an air line calibrator.

S3: obtaining calibration parameters within a range of $-0.5 < \rho \leq 0.15$ of the reflection coefficient.

S301: obtaining a parameter of a reference calibrator as follows: entering a calibration state, and selecting a calibration mode; connecting a coaxial cable to the time-domain reflectometer, and retaining an end of the coaxial cable in an open circuit; measuring a midpoint at 50% of an amplitude of a rising edge of an open circuit pulse as a start point $t_{1,Std}$ of a time measurement of the calibrator;

selecting a 25Ω air line as the reference calibrator, wherein the 25Ω air line has an exact characteristic impedance value of $Z_{std,25}$; connecting the 25Ω air line to the cable, and measuring a midpoint at 50% of an amplitude of a rising edge of an open circuit pulse at this time as an end point $t_{2,25}$ of the time measurement of the reference calibrator;

calculating a time $T_{rt,25}$ corresponding to a total length of a 25Ω calibrator by the following formula:

$$T_{rt,25} = t_{2,25} - t_{1,Std};\text{ and}$$

selecting a time period of 65%-85% or 60%-80% of the time $T_{rt,25}$ corresponding to the total length of the 25Ω calibrator as an area $T_{if,25}$ for calculating a 25Ω characteristic impedance, and measuring a mean value $V_{std,25}$ of a reflected voltage amplitude in the area $T_{if,25}$.

S302: obtaining a parameter of a reference calibrator as follows: selecting a 50Ω air line as the reference calibrator, removing the 25Ω air line, and connecting the 50Ω air line to the cable, wherein the 50Ω air line has an exact characteristic impedance value of $Z_{std,50}$;

measuring a midpoint at 50% of an amplitude of a rising edge of an open circuit pulse at this time as an end point $t_{2,50}$ of the time measurement of the reference calibrator;

calculating a time $T_{rt,50}$ corresponding to a total length of a 50Ω calibrator by the following formula:

$$T_{rt,50}=t_{2,50}-t_{1,Std};\text{ and}$$

selecting a time period of 50%-70% of the time $T_{rt,50}$ corresponding to the total length of the 50Ω calibrator as an area $T_{if,50}$ for calculating a 50Ω characteristic impedance, and measuring a mean value $V_{std,50}$ of a reflected voltage amplitude in the area $T_{if,50}$.

S303: calculating a reflection coefficient of the connected 25Ω calibrator by the following formula:

$$V_{r,25}=V_{std,25}-V_{std,50}.$$

S304: calculating an equivalent voltage amplitude of an incident pulse by the following formula:

$$V_{i,g50} = (V_{std,25} - V_{std,50})\frac{Z_{std,25} - Z_{std,50}}{Z_{std,25} + Z_{std,50}}.$$

S305: storing $V_{std,50}$ and $V_{i,g50}$ obtained from S301-S305 as the calibration parameters. When calibration of 50Ω and 25Ω is completed, that is, calibration of the reflection coefficient within the range of $-0.5<\rho\leq0.15$ is completed, the corresponding impedance range of the device under test (DUT) is 15Ω<Z≤65Ω.

S4: obtaining calibration parameters within a range of $0.15<\rho\leq0.25$ of the reflection coefficient.

S401: removing the 50Ω air line, and connecting a 75Ω air line, wherein the 75Ω air line has an exact characteristic impedance value of $Z_{std,75}$, and the 75Ω air line is used as the reference calibrator to continue the calibration;

measuring a midpoint at 50% of an amplitude of a rising edge of an open circuit pulse at this time as an end point $t_{2,75}$ of the time measurement of the reference calibrator;

calculating a time $T_{rt,75}$ corresponding to a total length of a 75Ω calibrator by the following formula:

$$T_{rt,75}=t_{2,75}-t_{1,Std};\text{ and}$$

selecting a time period of 50%-70% of the time $T_{rt,75}$ corresponding to the total length of the 75Ω calibrator as an area $T_{if,75}$ for calculating a 75Ω characteristic impedance, and measuring a mean value $V_{std,75}$ of a reflected voltage amplitude in the area $T_{if,75}$.

S402: calculating a reflection coefficient of the connected 75Ω calibrator by the following formula:

$$V_{r,75}=V_{std,75}-V_{std,50}.$$

S403: calculating an equivalent voltage amplitude of an incident pulse by the following formula:

$$V_{i,g75} = (V_{std,75} - V_{std,50})\frac{Z_{std,75} - Z_{std,50}}{Z_{std,75} + Z_{std,50}}.$$

S404: storing $V_{std,75}$ and $V_{i,g75}$ obtained from S401-S404 as the calibration parameters. When calibration of 75Ω is completed, that is, calibration of the reflection coefficient within the range of $0.15<\rho\leq0.25$ is completed, a corresponding impedance range of the DUT is 65Ω<Z≤85Ω.

S5: replacing the 75Ω air line with 12.5Ω, 100Ω, 150Ω, 180Ω and 220Ω air lines, respectively, and performing steps S401 to S404 to obtain calibration parameters within different ranges of the reflection coefficient.

S6: obtaining the characteristic impedance of the DUT by testing the DUT.

In step S5, when a reference calibrator of 12.5Ω is used, calibration parameters $V_{std,12.5}$ and $V_{std,12.5}$ within a range of $-1\leq\rho\leq-0.5$ of the reflection coefficient are obtained;

when a reference calibrator of 100Ω is used, calibration parameters $V_{std,100}$ and $V_{i,g100}$ within a range of $0.25<\rho\leq0.45$ of the reflection coefficient are obtained;

when a reference calibrator of 150Ω is used, calibration parameters $V_{std,150}$ and $V_{i,g150}$ within a range of $0.45<\rho\leq0.54$ of the reflection coefficient are obtained;

when a reference calibrator of 180Ω is used, calibration parameters $V_{std,180}$ and $V_{i,g180}$ within a range of $0.54<\rho\leq0.6$ of the reflection coefficient are obtained; and when a reference calibrator of 220Ω is used, calibration parameters $V_{std,180}$ and $V_{std,180}$ within a range of $0.6<\rho<+\infty$ of the reflection coefficient are obtained.

Step S6 includes the following substeps:

S601: connecting the DUT to the cable, and measuring a midpoint at 50% of an amplitude of a rising edge of an open circuit pulse at this time as an end point $t_{2,DUT}$ of the time measurement of the reference calibrator;

S602: calculating a time $T_{rt,DUT}$ corresponding to a total length of the DUT by the following formula: $T_{rt,DUT}=t_{2,DUT}-t_{1,Std}$, and specifying a time period corresponding to the total length of the DUT as a test area $T_{if,DUT}$;

S603: assuming a voltage amplitude corresponding to a sampling time point x in the test area $T_{if,DUT}$ as $V_{C,x}$, calculating a reflected voltage $V_{r,x}$ of the DUT corresponding to the time point x by the following formula:

$$V_{r,x}=V_{C,x}-V_{std,50};$$

S604: calculating a reflection coefficient $\rho_x$ of the DUT corresponding to the time point x by the following formula:

$$\rho_x = \frac{V_{r,x}}{V_{i,g50}};$$

if the reflection coefficient satisfies $-0.5<\rho_x\leq0.15$, then calculating a characteristic impedance $Z_x$ of the DUT corresponding to the time point x by the following formula:

$$Z_x = Z_{std50}\frac{V_{i,g50} + (V_{C,x} - V_{std,50})}{|V_{i,g50} - (V_{C,x} - V_{std,50})|};$$

if the reflection coefficient does not satisfy $-0.5<\rho_x\leq0.15$, then determining which range divided in step S1 the reflection coefficient $\rho_x$ is located in; selecting the calibration parameters corresponding to a reference calibration impedance according to a determined range of the reflection coefficient, and calculating the characteristic impedance $Z_x$ of the DUT corresponding to the time point x by the following formula:

$$Z_x = Z_{stdR} \frac{V_{i,gR} + (V_{C,x} - V_{std,R})}{|V_{i,gR} - (V_{C,x} - V_{std,R})|};$$

where, R is the reference calibration impedance with a unit of Ω, and is determined from 12.5, 100, 150, 180 or 220 according to the range of the reflection coefficient $\rho_x$;

S605: as for all sampling time points in the test area $T_{if,DUT}$, separately calculating characteristic impedances of the DUT at all the sampling time points according to steps S603-S604, then calculating a mean value of the obtained characteristic impedances as a final characteristic impedance of the DUT.

The present invention has the following advantages. (1) When the present invention performs calibration, an equivalent calculation algorithm is used to calculate a more accurate amplitude value of an incident voltage, which solves the problem of errors caused by the value of the measuring area. (2) The present invention adopts multiple non-standard impedances to successively perform the calibration, that is, multi-point segmented calibration technology, which solves the problem of different system errors of non-standard impedances, and increases the test accuracy of 12.5Ω, 25Ω, 100Ω, 150Ω, 180Ω, 220Ω, 240Ω and other special impedance values.

DETAILED DESCRIPTION OF THE EMBODIMENTS

The technical solution of the present invention is further described in detail below in combination with the drawings, but the scope of protection of the present invention is not limited to the following.

Figure 1:
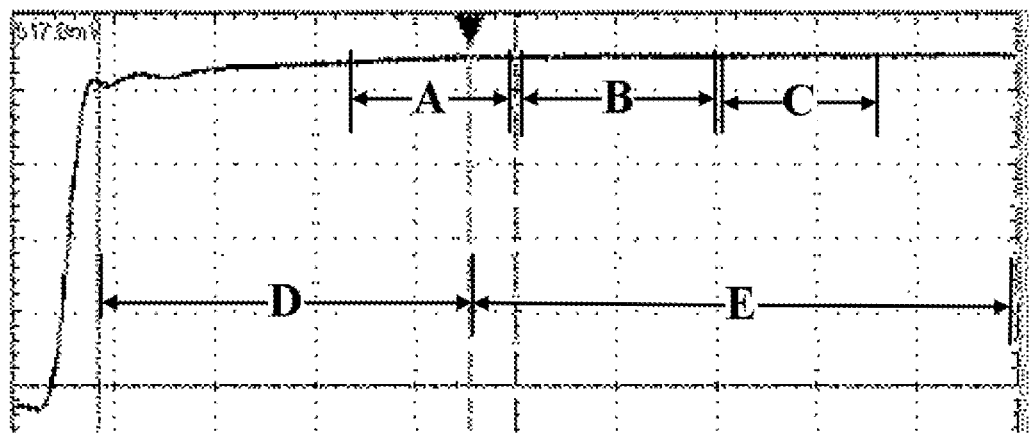
FIG. 1 is a schematic diagram of a pulse distortion waveform.

As shown in FIG. 1, the high-speed pulse emitted by the time-domain reflectometer is transmitted to a device under test (DUT) through a lossy transmission medium. The loss of the high-frequency component of the pulse signal causes distortion of the pulse waveform. At this time, the pulse exhibits an obvious undershoot state. The output impedance of the time-domain reflectometer is 50Ω, and the measurement waveform of the non-50Ω impedance value is a sloping curve. The slope of the impedance value greater than 50Ω is positive, and the slope of the impedance value less than 50Ω is negative. As the difference between the measured impedance value and 50Ω increases, the slope of the waveform increases, the transition time (Segment D) required by the step pulse of the time-domain reflectometer that steps from the 50Ω voltage to the voltage of the DUT increases, the stabilization time (Segment E) decreases, and the measurement error increases. If the selected measurement area (Segment B) of the two calibration areas (or measurement areas) before and after approaches the previous point (Segment A) or the latter point (Segment C), the difference in the measured results of the incident voltage amplitude ($V_{i,0}$) is even greater. When the calibration of the first and second time periods selects the different measurement areas, the calibration results are quite different.

Figure 2:
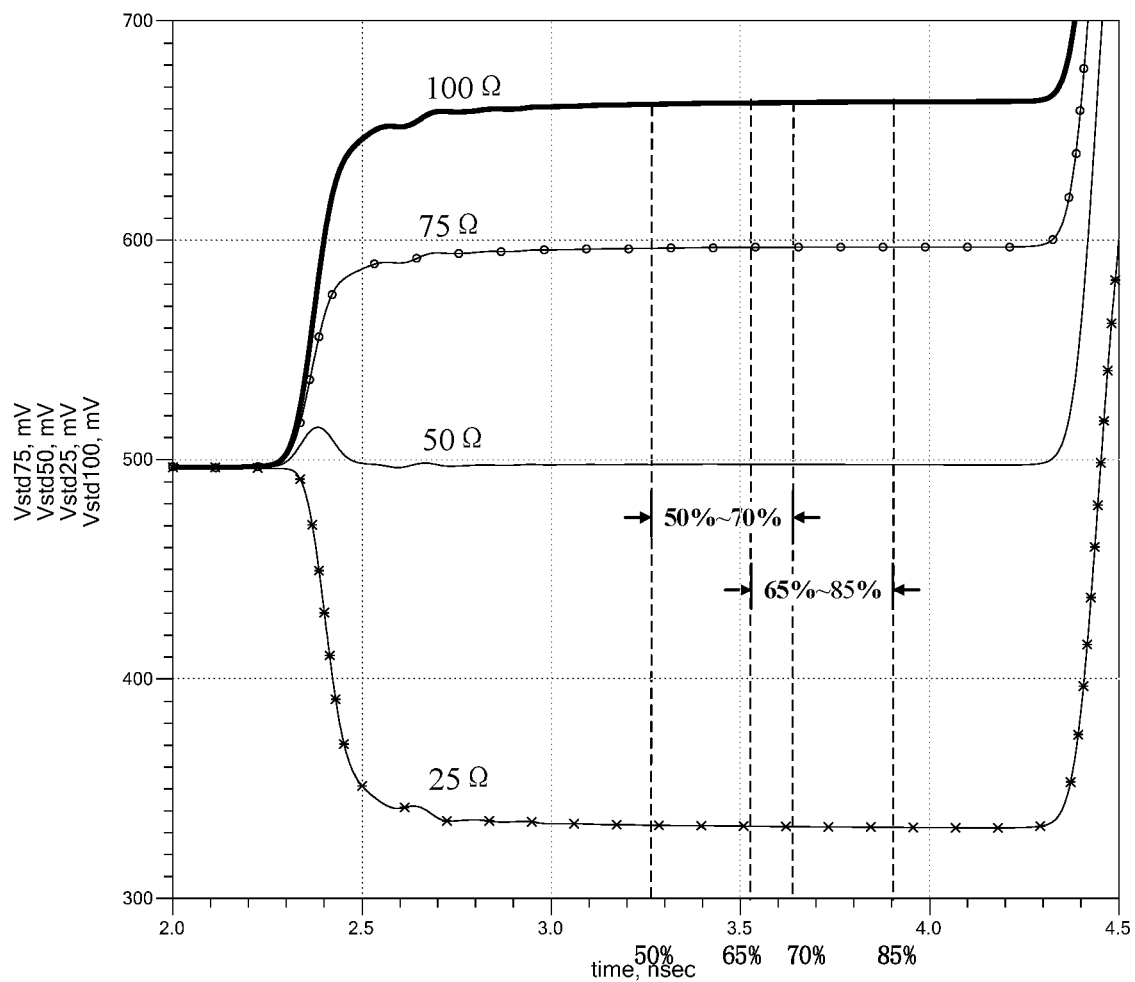
FIG. 2 is a comparison chart of different impedance waveforms.

The IPC standard does not specify how to select the measurement area, but only one example suggests that the measurement area should select 30%-70% (measurement start point-measurement end point) of the TDR waveform or be determined by the instrument user. In the industrial product test, 50%-70% of the measurement area is generally selected to take both the low impedance value and the high impedance value into account, but when the low impedance value (<33Ω) or high impedance value (>83Ω) is tested under stricter requirements, the error is still large and thus cannot meet the test requirements of special impedance. As shown in FIG. 2, at 50%-70% of the area, the flat area of the waveform of each impedance is different, and 25Ω and 100Ω waveforms are not as flat as 50Ω and 75Ω waveforms. If the same area is selected to calibrate the characteristic impedance, then measurement errors occur. In order to obtain accurate measurement results of the characteristic impedance, different DUTs select different measurement areas. In addition to the low impedance value (<33Ω) and the high impedance value (>83Ω), 65%-85% should be selected. If the rising edge of TDR is relatively sharp, 60%-80% can also be selected as the calibration and test area.

In view of the above, it is necessary to provide a method for calibrating a time-domain reflectometer, which can satisfy high-precision test requirements of 12.5Ω, 25Ω, 100Ω, 150Ω, 180Ω, 220Ω, 240Ω and other special impedance value. An objective of the present invention is to overcome the shortcomings of the prior art, and to provide a method for calibrating the characteristic impedance of the time-domain reflectometer in the time-domain dual reference line, which can greatly reduce the measurement error and improve the measurement accuracy of the time-domain reflectometer.

The invention discloses a time-domain segmented calibration method for a time-domain reflectometer. The method first segments the measured characteristic impedance value according to the reflection coefficients ρ, determines several boundary points with the reflection coefficients, divides the range of the measured impedance according to the impedance values corresponding to the reflection coefficients of the boundary points, and then select a typical impedance value in the range as a reference impedance for calibration. The TDR instrument performs characteristic impedance calibration for each typical reference impedance value one by one, and stores them as calibration parameters of different groups. With respect to different impedance value ranges, the selection ranges of the calibration and measurement areas of TDR are different. When the measurement is performed, the 50Ω calibration parameter is used as the default reference for calculation. If the measured reflection coefficient is not within 0.5<ρ≤0.15, that is, the impedance value is not within 15Ω<Z≤65Ω, it is necessary to call the calibration parameter of the corresponding group for the second calculation according to the range in which the measured impedance value falls, so as to obtain more accurate measurement results.

Figure 3:
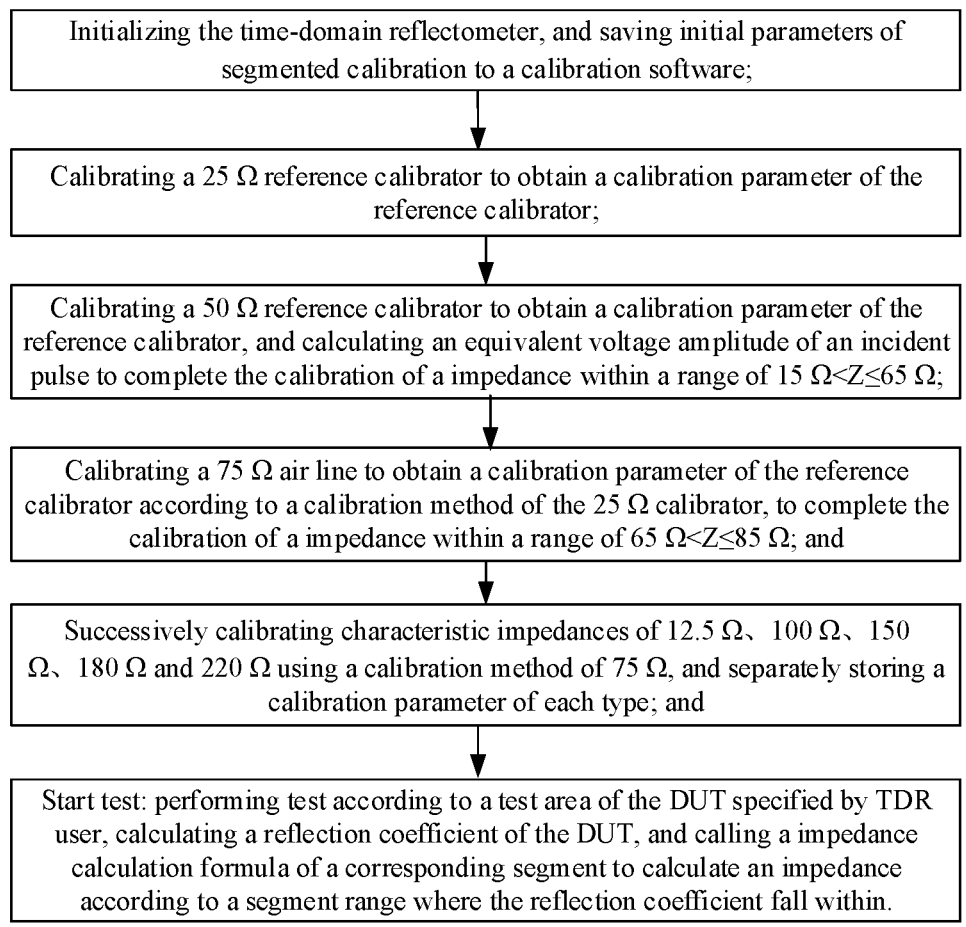
FIG. 3 is a flow chart showing the method of the present invention.

Specifically, as shown in FIG. 3, a time-domain segmented calibration method for a characteristic impedance of a time-domain reflectometer includes the following steps.

S1. Initial parameters and corresponding relationships of a segmented calibration are saved. The initial parameters of the segmented calibration include a reflection coefficient (ρ) of a boundary point, a measured impedance value range (Z), a calibration reference impedance, and a selection range of a calibration and measurement area of the time-domain reflectometer. The details are shown in the following table:

| Serial number | Boundary reflection coefficient | Measured impedance value range | Calibration reference impedance (ρ) | Selection range of calibration and measurement area of TDR |
|---|---|---|---|---|
| 1 | $-1 \leq \rho \leq -0.5$ | $0 \leq Z \leq 15\ \Omega$ | $12.5\ \Omega\ (-0.6)$ | 65%-85% or |
| 2 | $-0.5 \leq \rho \leq -0.2$ | $15\ \Omega < Z \leq 35\ \Omega$ | $25\ \Omega\ (-0.333)$ | 60%-80% |
| 3 | $-0.2 < \rho \leq 0.15$ | $35\ \Omega < Z \leq 65\ \Omega$ | $50\ \Omega\ (0)$ | 50%-70% |
| 4 | $0.15 < \rho \leq 0.25$ | $65\ \Omega < Z \leq 85\ \Omega$ | $75\ \Omega\ (0.2)$ | |
| 5 | $0.25 < \rho \leq 0.45$ | $85\ \Omega < Z \leq 130\ \Omega$ | $100\ \Omega\ (0.333)$ | 65%-85% or |
| 6 | $0.45 < \rho \leq 0.54$ | $130\ \Omega < Z \leq 170\ \Omega$ | $150\ \Omega\ (0.5)$ | 60%-80% |
| 7 | $0.54 < \rho \leq 0.6$ | $170\ \Omega < Z \leq 200\ \Omega$ | $180\ \Omega\ (0.565)$ | |
| 8 | $0.6 < \rho < +\infty$ | $200\ \Omega < Z < +\infty$ | $220\ \Omega\ (0.629)$ | |

S2. The time-domain reflectometer is initialized to measure and display a total length of an air line calibrator.

S3. Calibration parameters within a range of $-0.5 < \rho \leq 0.15$ of the reflection coefficient are obtained by the following steps.

S301. A parameter of a reference calibrator is obtained as follows. A calibration state is entered, and a calibration mode is selected. A coaxial cable is connected to the time-domain reflectometer, and an end of the coaxial cable is retained in an open circuit. The midpoint at 50% of an amplitude of a rising edge of an open circuit pulse is measured as the start point $t_{1,std}$ of a time measurement of the calibrator.

A 25Ω air line is selected as the reference calibrator, and has an exact characteristic impedance value of $Z_{std,25}$. The 25Ω air line is connected to the cable, and the midpoint at 50% of an amplitude of a rising edge of an open circuit pulse at this time is measured as the end point $t_{2,25}$ of the time measurement of the reference calibrator.

The time $T_{rt,25}$ corresponding to the total length of the 25Ω calibrator is calculated by the following formula:

$$T_{rt,25} = t_{2,25} - t_{1,Std}.$$

A time period of 65%-85% or 60%-80% of the time $t_{rt,25}$ corresponding to the total length of the 25Ω calibrator is selected as the area $T_{if,25}$ for calculating the 25Ω characteristic impedance, and the mean value $V_{std,25}$ of the reflected voltage amplitude in the area $T_{if,25}$ is measured.

S302. A parameter of a reference calibrator is obtained as follows. A 50Ω air line is selected as the reference calibrator, and the 25Ω air line is removed. The 50Ω air line is connected to the cable and has an exact characteristic impedance value of $Z_{std,50}$.

The midpoint at 50% of an amplitude of a rising edge of an open circuit pulse at this time is measured as the end point $t_{2,50}$ of the time measurement of the reference calibrator.

The time $T_{rt,50}$ corresponding to the total length of the 50Ω calibrator is calculated by the following formula:

$$T_{rt,50} = t_{2,50} - t_{1,Std}.$$

A time period of 50%-70% of the time $T_{rt,50}$ corresponding to the total length of the 50Ω calibrator is selected as the area $T_{if,50}$ for calculating the 50Ω characteristic impedance, and the mean value $V_{std,50}$ of the reflected voltage amplitude in the area $T_{if,50}$ is measured.

Figure 4:
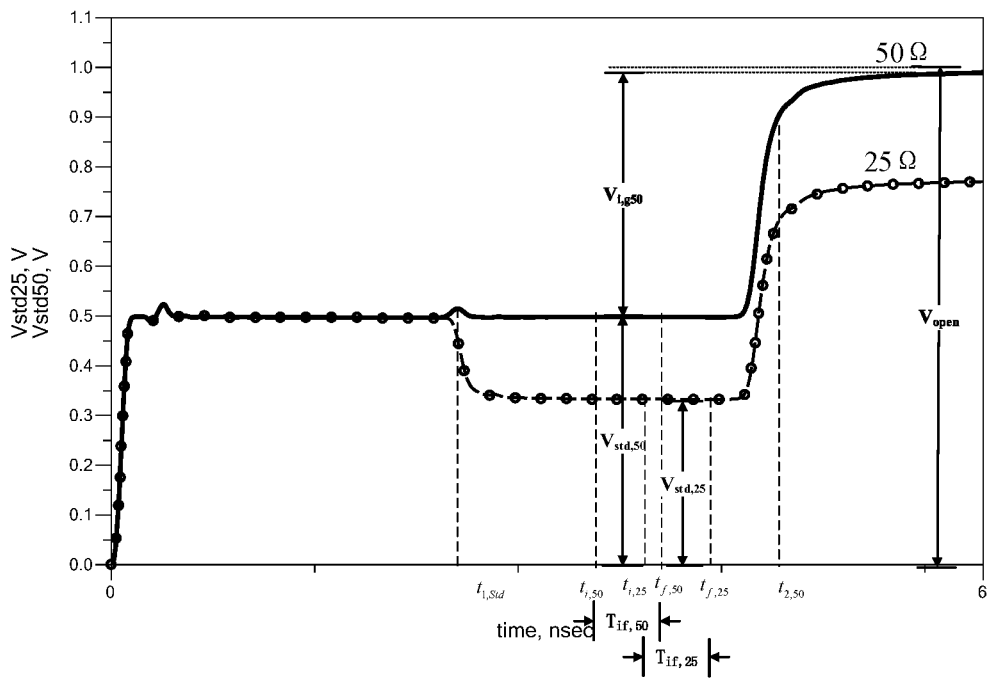
FIG. 4 is a schematic diagram of the TDR waveform during the calibration of the 25Ω reference calibrator and the 50Ω reference calibrator.

FIG. 4 shows a schematic diagram of the TDR waveform for calibrating 25Ω reference calibrator and 50Ω reference calibrator.

S303. The reflection coefficient of the connected 25Ω calibrator is calculated by the following formula:

$$V_{r,25} = V_{std,25} - V_{std,50}.$$

S304. The equivalent voltage amplitude of the incident pulse is calculated by the following formula:

$$V_{i,g50} = (V_{std,25} - V_{std,50}) \frac{Z_{std,25} - Z_{std,50}}{Z_{std,25} + Z_{std,50}}.$$

S305. $V_{std,50}$ and $V_{i,g50}$ obtained from S301-S305 are stored as the calibration parameters. When the calibration of 50Ω and 25Ω is completed, that is, the calibration of the reflection coefficient within the range of $-0.5 < \rho \leq 0.15$ is completed, the corresponding impedance range of the DUT is $15\Omega < Z \leq 65\Omega$.

S4. Calibration parameters within a range of $0.15 < \rho \leq 0.25$ of the reflection coefficient are obtained by the following steps.

S401. The 50Ω air line is removed. A 75Ω air line is connected, and has an exact characteristic impedance value of $Z_{std,75}$. The 75Ω air line is used as the reference calibrator to continue the calibration.

The midpoint at 50% of an amplitude of a rising edge of an open circuit pulse at this time is measured as the end point $t_{2,75}$ of the time measurement of the reference calibrator.

The time $T_{rt,75}$ corresponding to the total length of the 75Ω calibrator is calculated by the following formula:

$$T_{rt,75} = t_{2,75} - t_{1,Std}.$$

A time period of 50%-70% of the time $T_{rt,75}$ corresponding to the total length of the 75Ω calibrator is selected as the area $T_{if,75}$ for calculating the 75Ω characteristic impedance, and the mean value $V_{std,75}$ of the reflected voltage amplitude in the area $T_{if,75}$ is measured.

S402. The reflection coefficient of the connected 75Ω calibrator is calculated by the following formula:

$$V_{r,75} = V_{std,75} - V_{std,50}.$$

S403. The equivalent voltage amplitude of the incident pulse is calculated by the following formula:

$$V_{i,g75} = (V_{std,75} - V_{std,50})\frac{Z_{std,75} - Z_{std,50}}{Z_{std,75} + Z_{std,50}}.$$

S404. $V_{std,75}$ and $V_{i,g75}$ obtained from S401-S404 are stored as the calibration parameters. When calibration of the 75Ω is completed, that is, calibration of the reflection coefficient within the range of 0.15<ρ≤0.25 is completed, the corresponding impedance range of the DUT is 65Ω<Z≤85Ω.

S5. The 75Ω air line is replaced with 12.5Ω, 100Ω, 150Ω, 180Ω and 220Ω air lines, respectively, and steps S401 to S404 are performed to obtain calibration parameters within different ranges of the reflection coefficient;

S6. The characteristic impedance of the DUT is obtained by testing the DUT.

In step S5, when a reference calibrator of 12.5Ω is used, calibration parameters $V_{std,1.25}$ and $V_{std,12.5}$ within a range of -1≤ρ≤-0.5 of the reflection coefficient are obtained;

when a reference calibrator of 100Ω is used, calibration parameters $V_{std,100}$ and $V_{i,g100}$ within a range of 0.25<ρ≤0.45 of the reflection coefficient are obtained;

when a reference calibrator of 150Ω is used, calibration parameters $V_{std,150}$ and $V_{i,g150}$ within a range of 0.45<ρ≤0.54 of the reflection coefficient are obtained;

when a reference calibrator of 180Ω is used, calibration parameters $V_{std,180}$ and $V_{i,g180}$ within a range of 0.54<ρ≤0.6 of the reflection coefficient are obtained; and when a reference calibrator of 220Ω is used, calibration parameters $V_{std,180}$ and $V_{std,180}$ within a range of 0.6<ρ<+∞ of the reflection coefficient are obtained.

S601. The DUT is connected to the cable, and the midpoint at 50% of an amplitude of a rising edge of an open circuit pulse at this time is measured as the end point $t_{2,DUT}$ of the time measurement of the reference calibrator.

S602. The time $T_{rt,DUT}$ corresponding to the total length of the DUT is calculated by the following formula: $T_{rt,DUT}=t_{2,DUT}-t_{1,Std}$ and a time period corresponding to the total length of the DUT is specified as the test area $T_{if,DUT}$.

S603. A voltage amplitude corresponding to a sampling time point x in the test area $T_{if,DUT}$ is assumed as $V_{C,x}$, the reflected voltage $V_{r,x}$ of the DUT corresponding to the time point x is calculated by the following formula:

$$V_{r,x}=V_{C,x}-V_{std,50}.$$

S604. The reflection coefficient $\rho_x$ of the DUT corresponding to the time point x is calculated by the following formula:

$$\rho_x = \frac{V_{r,x}}{V_{i,g50}}.$$

If the reflection coefficient satisfies -0.5<$\rho_x$≤0.15, then the characteristic impedance $Z_x$ of the DUT corresponding to the time point x is calculated by the following formula:

$$Z_x = Z_{std50}\frac{V_{i,g50} + (V_{C,x} - V_{std,50})}{|V_{i,g50} - (V_{C,x} - V_{std,50})|};$$

If the reflection coefficient does not satisfy -0.5<$\rho_x$≤0.15, then it is determined which range divided in step S1 the reflection coefficient $\rho_x$ is located in. Calibration parameters corresponding to the reference calibration impedance are selected according to the determined range of the reflection coefficient, and the characteristic impedance $Z_x$ of the DUT corresponding to the time point x is calculated by the following formula:

$$Z_x = Z_{stdR}\frac{V_{i,gR} + (V_{C,x} - V_{std,R})}{|V_{i,gR} - (V_{C,x} - V_{std,R})|};$$

where, R is the reference calibration impedance with the unit of Ω, and is determined from 12.5, 100, 150, 180 or 220 according to the range of the reflection coefficient $\rho_x$.

S605. As for all sampling time points in the test area $T_{if,DUT}$ the characteristic impedances of the DUT at all the sampling time points are separately calculated according to steps S603-S604, then the mean value of the obtained characteristic impedances is calculated as the final characteristic impedance of the DUT.

Finally, it should be noted that the above describes the preferred embodiments of the present invention. It should be understood that the present invention is not limited to the preferred embodiments disclosed herein and the preferred embodiments should not be regarded as an exclusion from other embodiments. The present invention can be used in other combinations, modifications and conditions, also can be modified within the scope of the inventive concept described herein through the above teachings, the techniques or knowledge in related arts. Modifications and changes made by those skilled in the art without departing from the spirit and scope of the present invention shall fall within the scope of protection of the appended claims of the present invention.

What is claimed is:

1. A time-domain segmented calibration method for a characteristic impedance of a time-domain reflectometer, comprising the following steps:
    S1: saving initial parameters and corresponding relationships of a segmented calibration; wherein the initial parameters of the segmented calibration comprise a reflection coefficient ρ of a boundary point, a measured impedance value range Z, a calibration reference impedance, and a selection range of a calibration and measurement area of the time-domain reflectometer;
    wherein when -1≤ρ≤-0.5, the measured impedance value range is 0≤Z≤15Ω, the calibration reference impedance is 12.5Ω, the selection range of the calibration and measurement area of the time-domain reflectometer is 65%-85% or 60%-80%;
    when -0.5<ρ≤-0.2, the measured impedance value range is 15Ω<Z≤35Ω, the calibration reference impedance is 25Ω, the selection range of the calibration and measurement area of the time-domain reflectometer is 65%-85% or 60%-80%;
    when -0.2<ρ≤0.15, the measured impedance value range is 35Ω<Z≤65Ω, the calibration reference impedance is 50Ω, and the selection range of the calibration and measurement area of the time-domain reflectometer is 50%-70%;
    when 0.15<ρ≤0.25, the measured impedance value range is 65Ω<Z≤85Ω, the calibration reference impedance is 75Ω, the selection range of the calibration and measurement area of the time-domain reflectometer is 50%-70%;

when 0.25<ρ≤0.45, the measured impedance value range is 85Ω<Z≤130Ω, the calibration reference impedance is 100Ω, the selection range of the calibration and measurement area of the time-domain reflectometer is 65%-85% or 60%-80%;

when 0.45<ρ≤0.54, the measured impedance value range is 130Ω<Z≤170Ω, the calibration reference impedance is 150Ω, the selection range of the calibration and measurement area of the time-domain reflectometer is 65%-85% or 60%-80%;

when 0.54<ρ≤0.6, the measured impedance value range is 170Ω<Z≤200Ω, the calibration reference impedance is 180Ω, the selection range of the calibration and measurement area of the time-domain reflectometer is 65%-85% or 60%-80%;

when 0.6<ρ<+∞, the measured impedance value range is 200Ω<Z<+∞, the calibration reference impedance is 220Ω, the selection range of the calibration and measurement area of the time-domain reflectometer is 65%-85% or 60%-80%;

S2: initializing the time-domain reflectometer, and enabling the time-domain reflectometer to measure and display a total length of an air line calibrator;

S3: obtaining calibration parameters within a range of −0.5<ρ≤0.15 of the reflection coefficient;

S301: obtaining a parameter of a reference calibrator as follows: entering a calibration state, and selecting a calibration mode; connecting a coaxial cable to the time-domain reflectometer, and retaining an end of the coaxial cable in an open circuit; measuring a midpoint at 50% of an amplitude of a rising edge of an open circuit pulse as a start point $t_{1,Std}$ of a time measurement of the reference calibrator;

selecting a 25Ω air line as the reference calibrator, wherein the 25Ω air line has an exact characteristic impedance value of $Z_{std,25}$; connecting the 25Ω air line to the coaxial cable, and measuring a midpoint at 50% of an amplitude of a rising edge of an open circuit pulse at this time as an end point $t_{2,25}$ of the time measurement of the reference calibrator;

calculating a time $T_{rt,25}$ corresponding to a total length of a 25Ω calibrator by the following formula:

$$T_{rt,25} = t_{2,25} - t_{1,Std};\text{ and}$$

selecting a time period of 65%-85% or 60%-80% of the time $T_{rt,25}$ corresponding to the total length of the 25Ω calibrator as an area $T_{if,25}$ for calculating a 25Ω characteristic impedance, and measuring a mean value $V_{std,25}$ of a reflected voltage amplitude in the area $T_{if,25}$;

S302: obtaining a parameter of a reference calibrator as follows: selecting a 50Ω air line as the reference calibrator, removing the 25Ω air line, and connecting the 50Ω air line to the coaxial cable, wherein the 50Ω air line has an exact characteristic impedance value of $Z_{std,50}$;

measuring a midpoint at 50% of an amplitude of a rising edge of an open circuit pulse at this time as an end point $t_{2,50}$ of the time measurement of the reference calibrator;

calculating a time $T_{rt,50}$ corresponding to a total length of a 50Ω calibrator by the following formula:

$$T_{rt,50} = t_{2,50} - t_{1,std};\text{ and}$$

selecting a time period of 50%-70% of the time $T_{rt,50}$ corresponding to the total length of the 50Ω calibrator as an area $T_{if,50}$ for calculating a 50Ω characteristic impedance, and measuring a mean value $V_{std,50}$ of a reflected voltage amplitude in the area $T_{if,50}$;

S303: calculating a reflection coefficient of the 25Ω calibrator by the following formula:

$$V_{r,25} = V_{std,25} - V_{std,50};$$

S304: calculating an equivalent voltage amplitude of an incident pulse by the following formula:

$$V_{i,g50} = (V_{std,25} - V_{std,50}) \frac{Z_{std,25} - Z_{std,50}}{Z_{std,25} + Z_{std,50}};$$

S305: storing $V_{std,50}$ and $V_{i,g50}$ obtained from S301-S305 as the calibration parameters; when a calibration of 50Ω and 25Ω is completed, that is, a calibration of the reflection coefficient within the range of −0.5<ρ≤0.15 is completed, the corresponding impedance range of a device under test (DUT) is 15Ω<Z≤65Ω;

S4: obtaining calibration parameters within a range of 0.15<ρ≤0.25 of the reflection coefficient;

S401: removing the 50Ω air line, and connecting a 75Ω air line, wherein the 75Ω air line has an exact characteristic impedance value of $Z_{std,75}$, and the 75Ω air line is used as the reference calibrator to continue the calibration;

measuring a midpoint at 50% of an amplitude of a rising edge of an open circuit pulse at this time as an end point $t_{2,75}$ of the time measurement of the reference calibrator;

calculating a time $T_{rt,75}$ corresponding to a total length of a 75Ω calibrator by the following formula:

$$T_{rt,75} = t_{2,75} - t_{1,Std};\text{ and}$$

selecting a time period of 50%-70% of the time $T_{rt,75}$ corresponding to the total length of the 75Ω calibrator as an area $T_{if,75}$ for calculating a 75Ω characteristic impedance, and measuring a mean value $V_{std,75}$ of a reflected voltage amplitude in the area $T_{if,75}$;

S402: calculating a reflection coefficient of the 75Ω calibrator by the following formula:

$$V_{r,75} = V_{std,75} - V_{std,50};$$

S403: calculating an equivalent voltage amplitude of an incident pulse by the following formula:

$$V_{i,g75} = (V_{std,75} - V_{std,50}) \frac{Z_{std,75} - Z_{std,50}}{Z_{std,75} + Z_{std,50}};\text{ and}$$

S404: storing $V_{std,75}$ and $V_{i,g75}$ obtained from S401-S404 as the calibration parameters; when a calibration of 75Ω is completed, that is, a calibration of the reflection coefficient within the range of 0.15<ρ≤0.25 is completed, a corresponding impedance range of the DUT is 65Ω<Z≤85Ω;

S5: replacing the 75Ω air line with 12.5Ω, 100Ω, 150Ω, 180Ω and 220Ω air lines, respectively, and performing steps S401 to S404 to obtain calibration parameters within different ranges of the reflection coefficient; and S6: obtaining the characteristic impedance of the DUT by testing the DUT.

2. The time-domain segmented calibration method for the characteristic impedance of the time-domain reflectometer according to claim 1, wherein in step S5,
   when a reference calibrator of 12.5Ω is used, calibration parameters $V_{std,12.5}$ and $V_{std,12.5}$ within a range of $-1 \leq \rho \leq -0.5$ of the reflection coefficient are obtained;
   when a reference calibrator of 100Ω is used, calibration parameters $V_{std,100}$ and $V_{i,g100}$ within a range of $0.25 < \rho \leq 0.45$ of the reflection coefficient are obtained;
   when a reference calibrator of 150Ω is used, calibration parameters $V_{std,150}$ and $V_{i,g150}$ within a range of $0.45 < \rho \leq 0.54$ of the reflection coefficient are obtained;
   when a reference calibrator of 180Ω is used, calibration parameters $V_{std,180}$ and $V_{i,g180}$ within a range of $0.54 < \rho \leq 0.6$ of the reflection coefficient are obtained; and
   when a reference calibrator of 220Ω is used, calibration parameters $V_{std,220}$ and $V_{i,g220}$ within a range of $0.6 < \rho < +\infty$ of the reflection coefficient are obtained.

3. The time-domain segmented calibration method for the characteristic impedance of the time-domain reflectometer according to claim 2, wherein step S6 comprises the following substeps:
   S601: connecting the DUT to the coaxial cable, and measuring a midpoint at 50% of an amplitude of a rising edge of an open circuit pulse at this time as an end point $t_{2,DUT}$ of the time measurement of the reference calibrator;
   S602: calculating a time $T_{rt,DUT}$ corresponding to a total length of the DUT by the following formula: $T_{rt,DUT} = t_{2,DUT} - t_{1,Std}$ and specifying a time period corresponding to the total length of the DUT as a test area $T_{if,DUT}$;
   S603: assuming a voltage amplitude corresponding to a sampling time point x in the test area $T_{if,DUT}$ as $V_{C,x}$, calculating a reflected voltage $V_{r,x}$ of the DUT corresponding to the time point x by the following formula:
   $$V_{r,x} = V_{C,x} - V_{std,50};$$
   S604: calculating a reflection coefficient $\rho_x$ of the DUT corresponding to the time point x by the following formula:

$$\rho_x = \frac{V_{r,x}}{V_{i,g50}};$$

when the reflection coefficient satisfies $-0.5 < \rho_x \leq 0.15$, calculating a characteristic impedance $Z_x$ of the DUT corresponding to the time point x by the following formula:

$$Z_x = Z_{std50} \frac{V_{i,g50} + (V_{C,x} - V_{std,50})}{|V_{i,g50} - (V_{C,x} - V_{std,50})|};$$

when the reflection coefficient does not satisfy $-0.5 < \rho_x \leq 0.15$, determining which range divided in step S1 the reflection coefficient $\rho_x$ is located in; selecting the calibration parameters corresponding to a reference calibration impedance according to a determined range of the reflection coefficient, and calculating the characteristic impedance $Z_x$ of the DUT corresponding to the time point x by the following formula:

$$Z_x = Z_{stdR} \frac{V_{i,gR} + (V_{C,x} - V_{std,R})}{|V_{i,gR} - (V_{C,x} - V_{std,R})|};$$

wherein, R is the reference calibration impedance with a unit of Ω, and R is determined from 12.5, 100, 150, 180 or 220 according to the determined range of the reflection coefficient $\rho_x$;
   S605: as for all sampling time points in the test area $T_{if,DUT}$, separately calculating characteristic impedances of the DUT at all the sampling time points according to steps S603-S604, then calculating a mean value of the obtained characteristic impedances as a final characteristic impedance of the DUT.

\* \* \* \* \*